United States Patent
Lee et al.

(10) Patent No.: US 8,953,398 B2
(45) Date of Patent: Feb. 10, 2015

(54) BLOCK LEVEL GRADING FOR RELIABILITY AND YIELD IMPROVEMENT

(75) Inventors: Dana Lee, Saratoga, CA (US); Jianmin Huang, San Carlos, CA (US); Mrinal Kochar, San Jose, CA (US); Ashish Ghai, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 408 days.

(21) Appl. No.: 13/527,199

(22) Filed: Jun. 19, 2012

(65) Prior Publication Data

US 2013/0336059 A1    Dec. 19, 2013

(51) Int. Cl.
*G11C 7/00* (2006.01)

(52) U.S. Cl.
USPC .. 365/200; 365/201; 365/185.18; 365/185.11

(58) Field of Classification Search
USPC .................. 365/200, 201, 185.18, 185.11
See application file for complete search history.

(56) References Cited

U.S. PATENT DOCUMENTS

| | | | |
|---|---|---|---|
| 6,014,755 A | 1/2000 | Wells et al. | |
| 6,426,893 B1 | 7/2002 | Conley et al. | |
| 7,690,031 B2 | 3/2010 | Ma et al. | |
| 7,861,122 B2 | 12/2010 | Cornwell et al. | |
| 8,015,346 B2 | 9/2011 | Chen et al. | |
| 8,040,744 B2 | 10/2011 | Gorobets et al. | |
| 8,046,645 B2 | 10/2011 | Hsu et al. | |
| 2009/0037645 A1 | 2/2009 | Hsieh | |
| 2009/0122949 A1* | 5/2009 | Reid et al. | 377/15 |
| 2010/0153616 A1 | 6/2010 | Garratt | |
| 2011/0029715 A1 | 2/2011 | Hu et al. | |
| 2011/0149650 A1 | 6/2011 | Huang et al. | |
| 2011/0271043 A1 | 11/2011 | Segal et al. | |
| 2012/0124273 A1 | 5/2012 | Goss et al. | |
| 2013/0007343 A1 | 1/2013 | Rub et al. | |
| 2013/0191700 A1 | 7/2013 | Griffin et al. | |

* cited by examiner

*Primary Examiner* — Vu Le
*Assistant Examiner* — Han Yang
(74) *Attorney, Agent, or Firm* — Brinks Gilson & Lione (57) ABSTRACT

A system for grading blocks may be used to improve memory usage. Blocks of memory, such as on a flash card, may be graded on a sliding scale that may identify a level of "goodness" or a level of "badness" for each block rather than a binary good or bad identification. This grading system may utilize at least three tiers of grades which may improve efficiency by better utilizing each block based on the individual grades for each block. The block leveling grading system may be used for optimizing the competing needs of minimizing yield loss while minimizing testing defect escapes.

20 Claims, 10 Drawing Sheets

| Usage | Grade | | | | | |
|---|---|---|---|---|---|---|
| | A | B | C | D | E | F |
| Unrestricted | R | | | | | |
| Use 1-page EPWR | O | R | | | | |
| Use 2-page EPWR | | O | R | | | |
| Use 3-page EPWR | | | O | R | | |
| Restrict to SLC | | | | O | R | |
| Mark as bad | | | | | O | R |

R = retail grade
O = OEM grade

US 8,953,398 B2

BLOCK LEVEL GRADING FOR RELIABILITY AND YIELD IMPROVEMENT

TECHNICAL FIELD

This application relates generally to memory devices. More specifically, this application relates to evaluating blocks of memory for protecting data and improving reliability in non-volatile semiconductor flash memory.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Identification of which blocks of memory are bad may be necessary for decreasing the risk of losing stored data. For example, blocks that are identified as bad may be avoided entirely, while good blocks or blocks that are not identified as bad may be used without restrictions. Further, when the number of bad blocks exceeds a specified limit, the memory die may be rejected as having insufficient capacity.

SUMMARY

It may be desirable to grade blocks of memory on a sliding scale. The sliding scale may identify a level of "goodness" or a level of "badness" for each block rather than a binary good or bad identification. This block level grading may improve efficiency by better utilizing each block based on the individual grades for each block. The block leveling grading system may be used for optimizing the competing needs of maximizing yield while minimizing a number of defects that escape a test. In other words, the block level grading should capture and identify defects, while at the same time allowing for a reasonable yield.

According to a first aspect, a flash memory device includes a non-volatile storage having an array of memory blocks storing data. A controller in communication with the non-volatile storage is configured for testing at least a portion of the memory blocks and grading the tested memory block by assigning each of the tested blocks one of at least three grades. Usage for some of the memory blocks is restricted based on the grade for those memory blocks.

According to a second aspect, a method is disclosed for writing to a multiple level cell flash memory in a non-volatile storage device having a controller and blocks of memory. The controller is configured to perform an initial test on the blocks of memory and assign a first grade to those blocks that pass the initial test. The controller is further configured to perform a second test on those blocks that did not pass the initial test and assign a second grade to those blocks that pass the second test. A third grade is assigned to those blocks that did not pass the second test.

According to a third aspect, a memory system comprises a non-volatile storage having an array of memory blocks storing data and a controller in communication with the blocks. The controller is configured for performing an initial test on at least some of the blocks and assigning a first grade to those blocks that pass the initial test. The controller is further configured for performing a secondary test on those tested blocks that did not pass the initial test and assigning a second grade to those blocks that passed the secondary test and assigning a third grade to those blocks that did not pass the secondary test. A listing of the grades is stored on one or more of the memory blocks.

BRIEF DESCRIPTION OF THE PRESENTLY PREFERRED EMBODIMENTS

Figure 1:
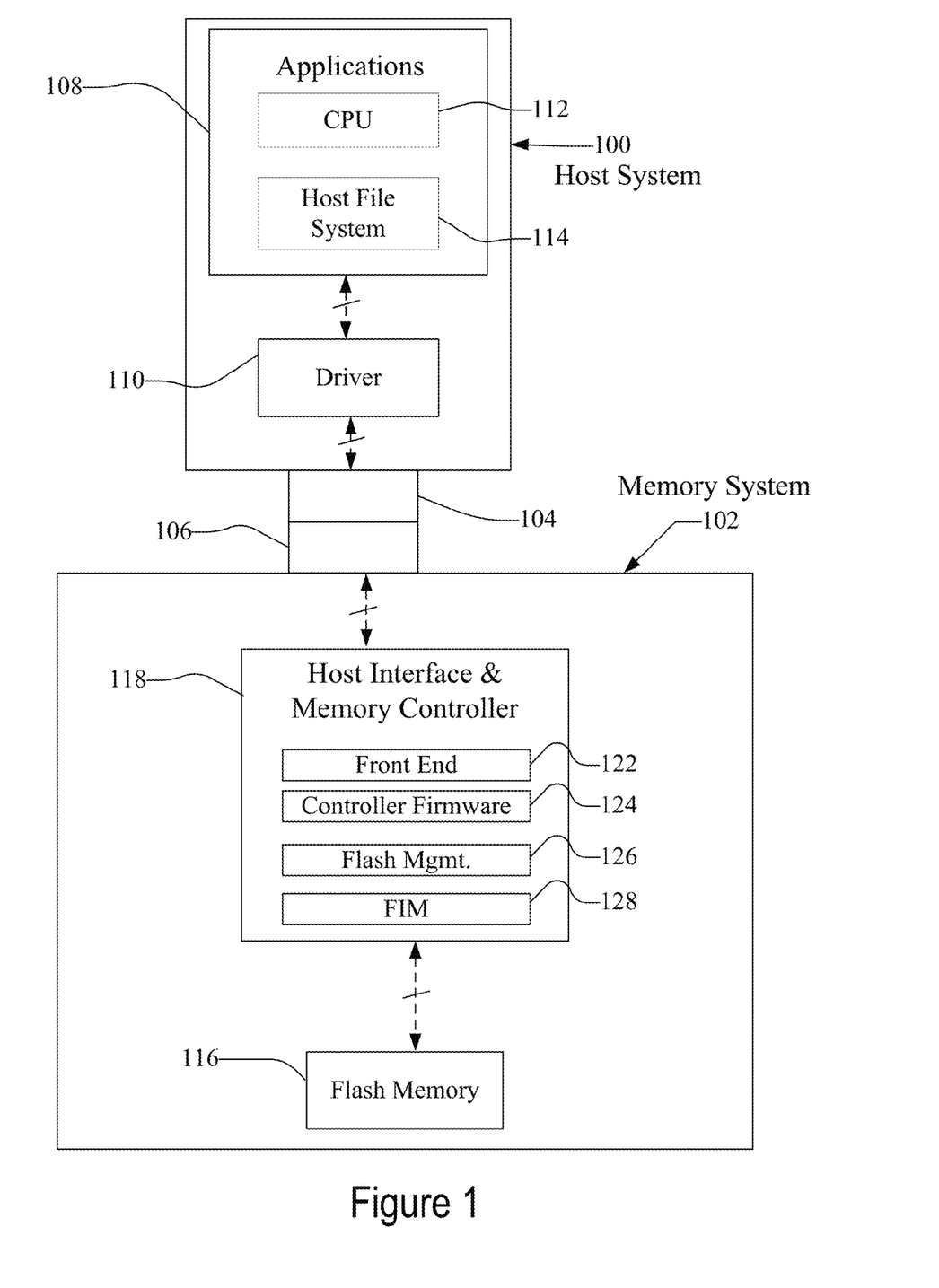
FIG. 1 is a block diagram of a host connected with a memory system having non-volatile memory.

A flash memory system suitable for use in implementing aspects of the invention is shown in FIGS. 1-6. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip.

The host system 100 of FIG. 1 may be viewed as having two major parts, insofar as the memory 102 is concerned, made up of a combination of circuitry and software. They are an applications portion 108 and a driver portion 110 that interfaces with the memory 102. There may be a central processing unit (CPU) 112 implemented in circuitry and a host file system 114 implemented in hardware. In a PC, for example, the applications portion 108 may include a processor 112 running word processing, graphics, control or other popular application software. In a camera, cellular telephone or other host system 114 that is primarily dedicated to performing a single set of functions, the applications portion 108 includes the software that operates the camera to take and store pictures, the cellular telephone to make and receive calls, and the like.

The memory system 102 of FIG. 1 may include non-volatile memory, such as flash memory 116, and a system controller 118 that both interfaces with the host 100 to which the memory system 102 is connected for passing data back and forth and controls the memory 116. The system controller 118 may convert between logical addresses of data used by the host 100 and physical addresses of the flash memory 116 during data programming and reading. Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
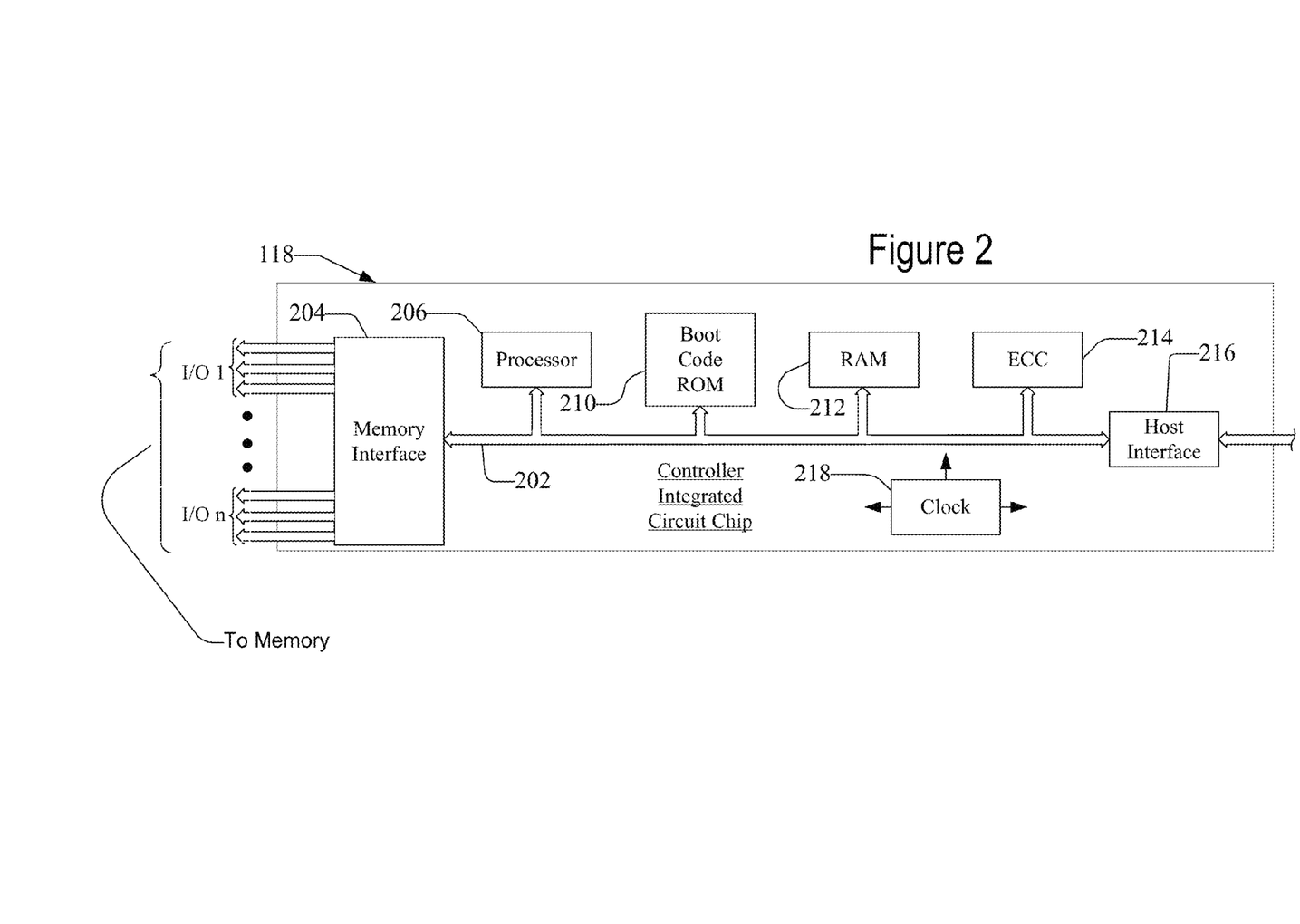
FIG. 2 is a block diagram of an exemplary flash memory system controller for use in the system of FIG. 1.

The system controller 118 may be implemented on a single integrated circuit chip, such as an application specific integrated circuit (ASIC) such as shown in FIG. 2. The processor 206 of the system controller 118 may be configured as a multi-thread processor capable of communicating via a memory interface 204 having I/O ports for each memory bank in the flash memory 116. The system controller 118 may include an internal clock 218. The processor 206 communicates with an error correction code (ECC) module 214, a RAM buffer 212, a host interface 216, and boot code ROM 210 via an internal data bus 202.

The ROM 210 may be used to initialize a memory system 102, such as a flash memory device. The memory system 102 that is initialized may be referred to as a card. The ROM 210 in FIG. 2 may be a region of read only memory whose purpose is to provide boot code to the RAM for processing a program, such as the initialization and booting of the memory system 102. The ROM may be present in the ASIC rather than the flash memory chip.

Figure 3:
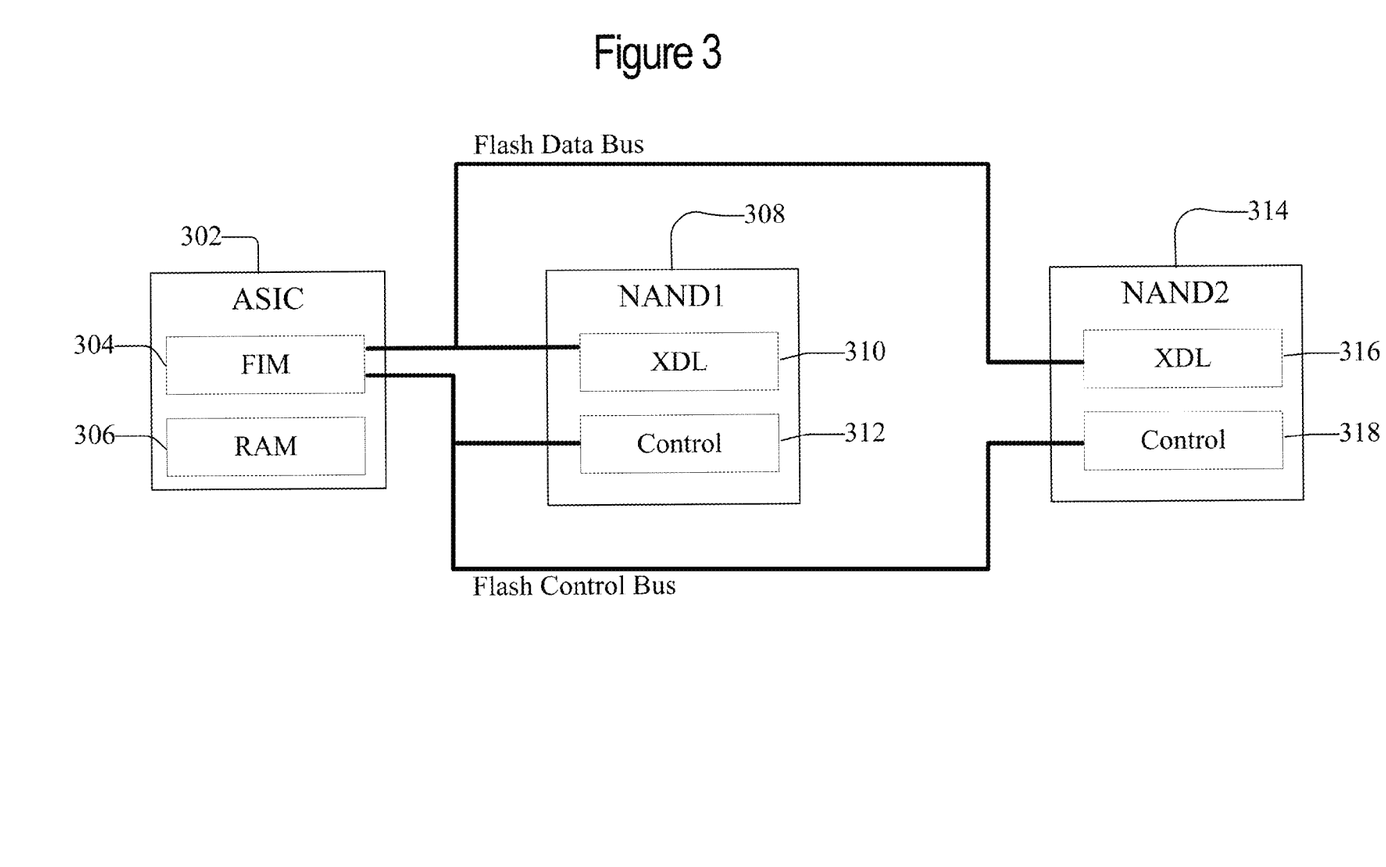
FIG. 3 is a block diagram of an alternative memory communication system.

FIG. 3 is a block diagram of an alternative memory communication system. An application-specific integrated circuit (ASIC) 302 may include a flash interface module (FIM) 304 and random access memory (RAM) 306. The ASIC 302 may be a chip that communicates with multiple flash memory modules or devices, such as NANDs 308, 314. The FIM 304 communicates data over the flash data bus and communicates control commands over the flash control bus. The NAND1 308 and NAND2 314 are types of flash memory that receive commands and data from the FIM 304 of the ASIC 302. Each of the NAND1 308 and NAND2 314 include controls 312, 318, respectively, for receiving control signals from the ASIC 302. Likewise, each of the NAND1 308 and NAND2 314 include an eXternal Data Latch (XDL) 310, 316, respectively, for receiving data signals from the ASIC 302. Although the flash data bus and flash control bus are illustrated as separate busses that communicate with the XDL 310, 316 and Control 312, 318 of the respective NANDs 308, 314, there may be a singular bus for communication.

Figure 4:
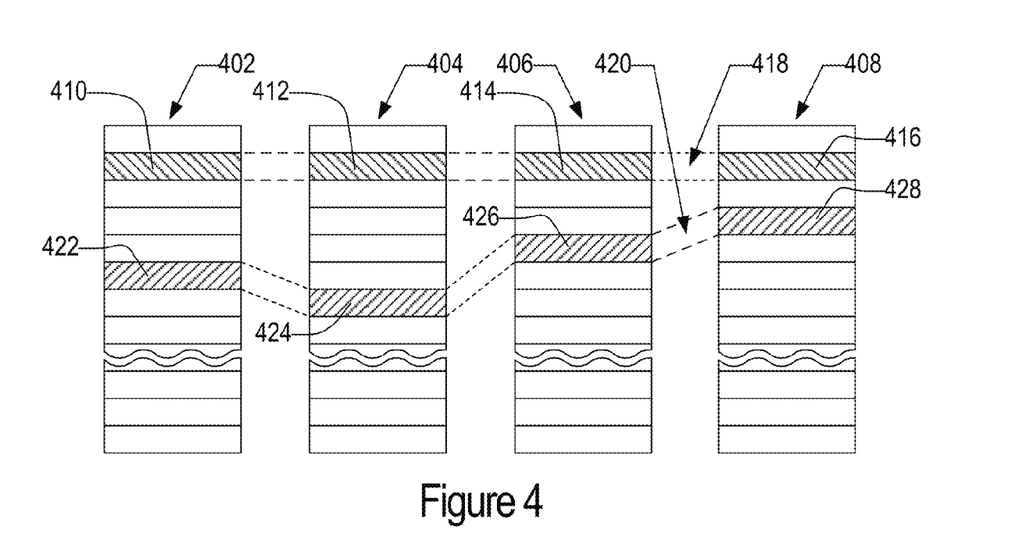
FIG. 4 is an example physical memory organization of the system of FIG. 1.

FIG. 4 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 402, 404, 406, and 408 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 4 by rectangles, such as blocks 410, 412, 414, and 416, located in respective planes 402, 404, 406, and 408. There can be any number of blocks in each plane. Certain blocks may be reserved as safe zone blocks (SZBs) that are protected blocks for protecting data that is written to predetermined risk zones, such as a lower page.

As mentioned above, the block of memory cells is the unit of erase, the smallest number of memory cells that are physically erasable together. For increased parallelism, however, the blocks may be operated in larger metablock units. One block from each plane is logically linked together to form a metablock. The four blocks 410, 412, 414, and 416 are shown to form one metablock 418. In one embodiment, the SZB is one or more metablocks. All of the cells within a metablock are typically erased together. The blocks used to form a metablock need not be restricted to the same relative locations within their respective planes, as is shown in a second metablock 420 made up of blocks 422, 424, 426, and 428. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 5:
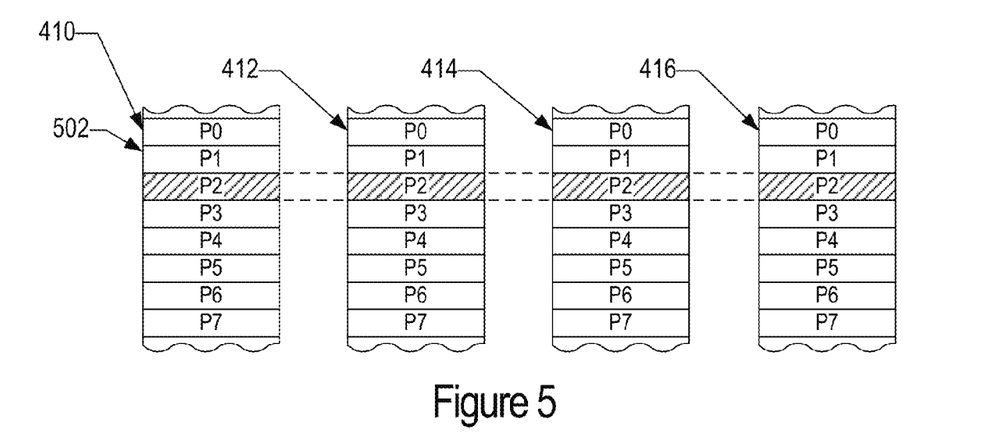
FIG. 5 is an expanded view of a portion of the physical memory of FIG. 4.

The individual blocks are in turn divided for operational purposes into pages of memory cells, as illustrated in FIG. 5. The memory cells of each of the blocks 410, 412, 414, and 416, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 502 is illustrated in FIG. 4, being formed of one physical page from each of the four blocks 410, 412, 414, and 416. The metapage 502, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 6:
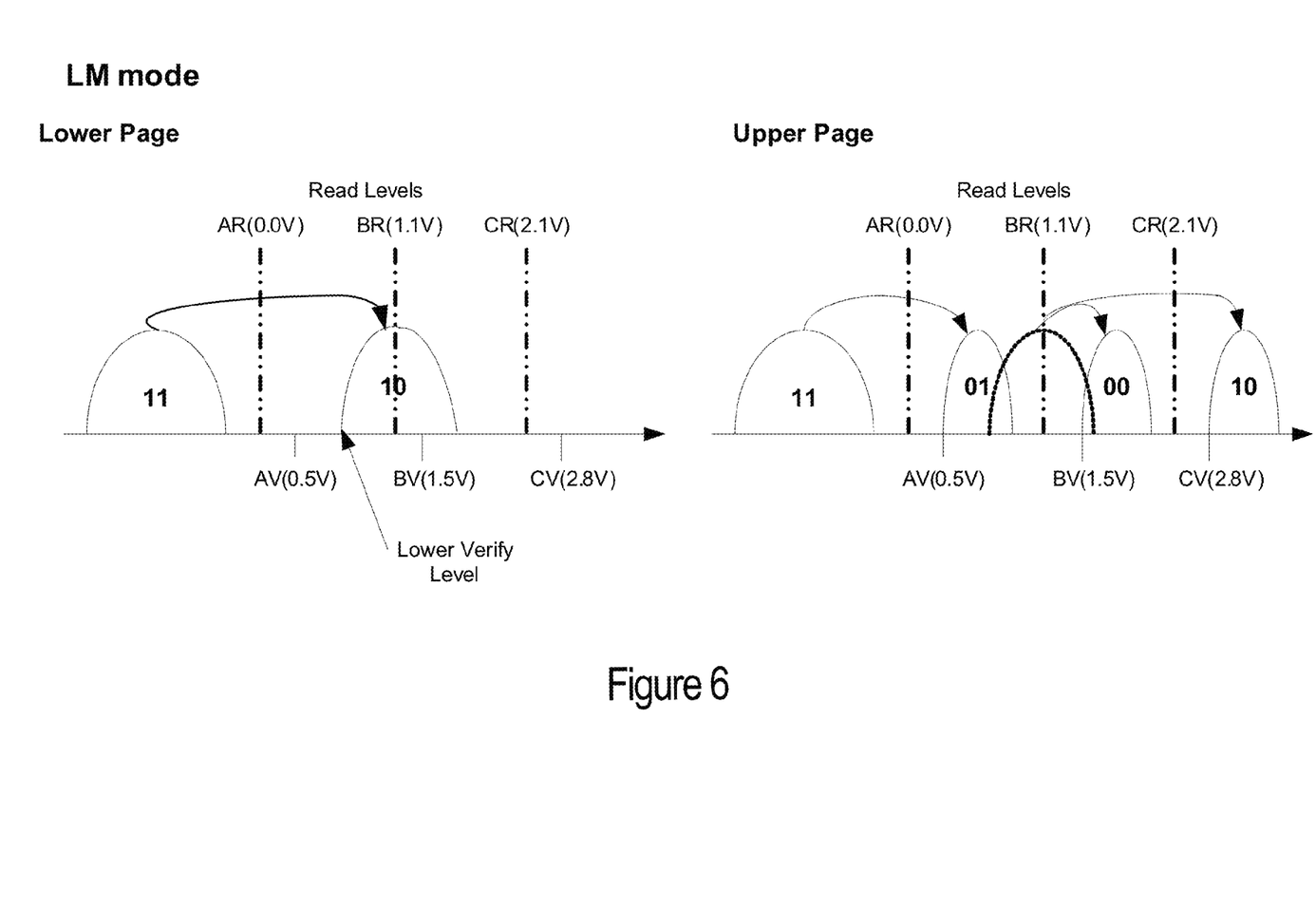
FIG. 6 is a diagram illustrating charge levels in a multi-level cell memory operated to store two bits of data in a memory cell.

FIG. 6 illustrates one implementation of the four charge levels used to represent two bits of data in a memory cell. FIG. 6 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 7:
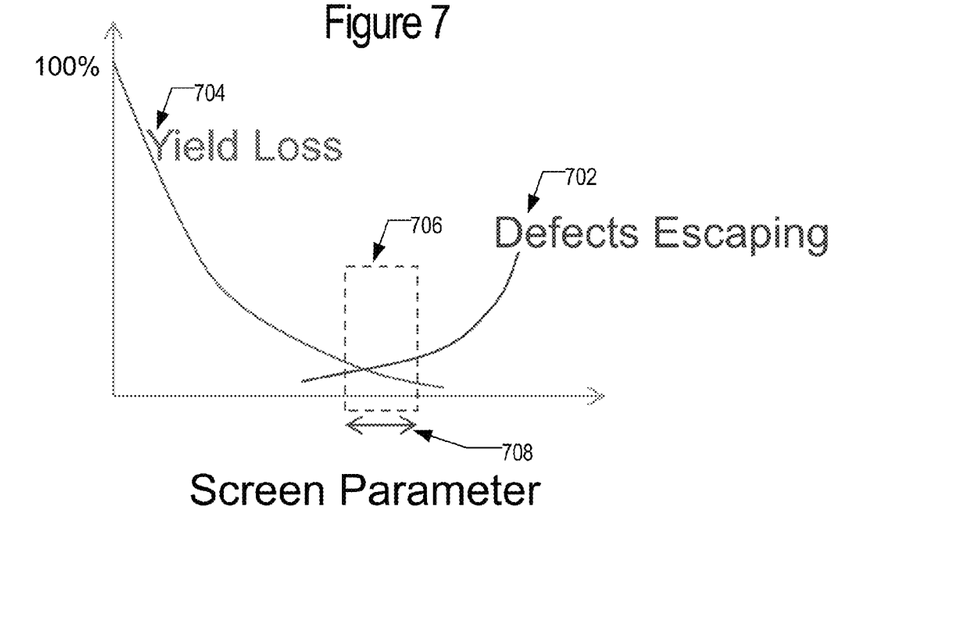
FIG. 7 is a diagram of yield loss versus escaped defects for a particular screen parameter.

FIG. 7 is a diagram of yield loss versus escaped defects for a particular screen parameter. In particular, FIG. 7 illustrates that the potential relationship between the number of defects that escape 702 and the yield loss 704 when analyzing or screening memory blocks. In particular, this may be part of a quality control analysis of memory in which testing is performed on memory chips to ensure that the blocks and/or bits in the memory are operating properly (i.e. low defects). This testing may be performed at the manufacturing stage, post manufacturing, or even at the end user stage. The defects escaping curve 702 measure may be a general quality measurement that attempts to determine which units should pass. The measurement for memory may be based on individual memory blocks or die or may be other measurements of memory quality. The grading may be done on an addressable sub-unit within the die or at the "block" level. Alternatively, the grading may be on the page or sector level. As described below, the units of measurements are memory blocks, but that is just one example and many other units are possible.

The testing attempts to reduce the number of defects that escape 702 the testing (also referred to herein as "escaped defects"). However, if the testing is overly sensitive (to catch all defects) then the yield for the memory may be poor (i.e. the yield loss 704 is high). In other words, if the test is overly sensitive to any defects escaping, then the number of blocks rejected (i.e. yield loss 704) for those defects will be high. The testing sensitivity may be referred to as a modification of or margining of the testing parameter or screen parameter. In other words, the screen parameter may be margined in either direction along the X-axis to change the yield loss or escaped defects.

The screening or testing may be an indirect measure that estimates the likelihood of defects. Accordingly, the testing sensitivity may be over-inclusive (higher quality, lower yield) or may be under-inclusive (higher yield, lower quality). Because of this indirect measurement, there may be normal non-defective blocks that are listed as having defects, which increases yield loss. As an analogy, a health measurement of one's cholesterol may indicate an increased likelihood of heart disease, but it does not necessarily mean there is a defect. Accordingly, the testing or screening performed on memory for different parameters may indicate the potential for a defect, but there may or may not be a defect. Accordingly, it may be necessary to optimize the testing or screening to maintain a high yield while also catching most defects.

FIG. 7 illustrates one example of optimization for maintaining both the yield loss 704 and the defects escaping 702 at low levels. In particular, there is a balancing zone 706 shown in FIG. 7 in which the yield is good, but the number of defects escaping is low. This balancing zone 706 is shown for a certain range 708 of the screen parameter. As shown in FIG. 7, the screen parameter may have a threshold value in the balancing zone 706 that is selected, such that all values to the left of the threshold pass the screening and all values to the right of the threshold fail the screening.

Figure 8:
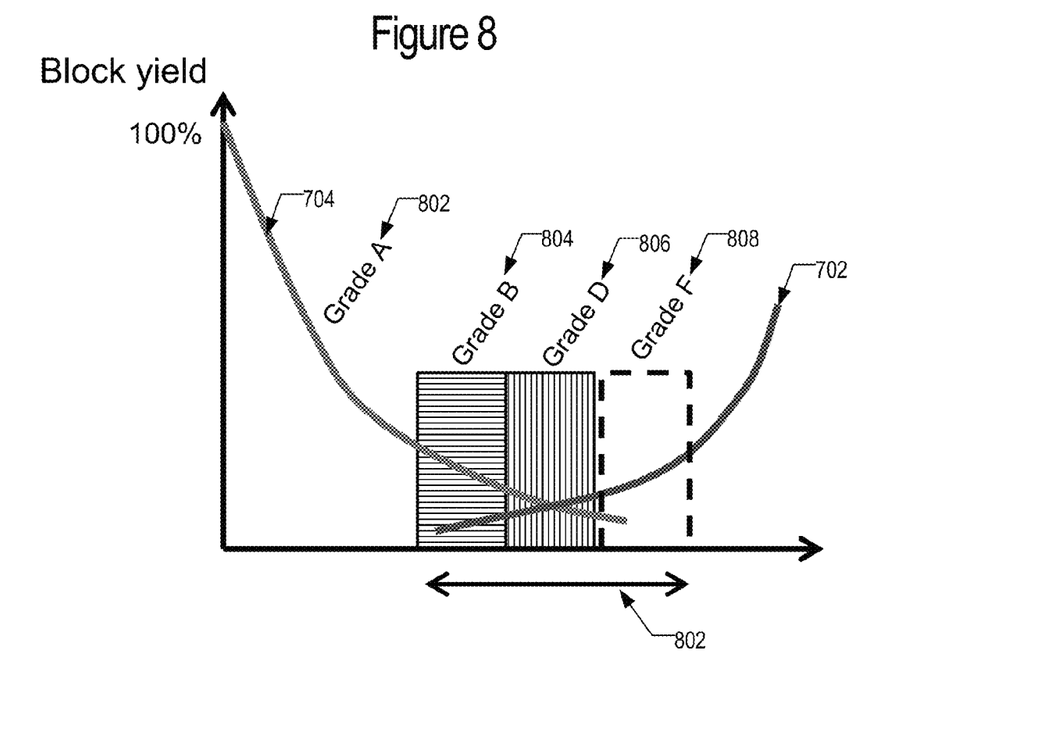
FIG. 8 is a diagram of yield loss versus escaped defects with a multi-tiered grading system.

FIG. 8 is a diagram of yield loss versus escaped defects with a multi-tiered grading system. Rather than a balancing zone 706 as in FIG. 7, FIG. 8 illustrates a grading system in which grades are assigned at various levels for the particular screen parameter. In one embodiment, the grading system is at least three tiers of grading (e.g. two tiers may include: good and bad blocks). The grading system tiers may also be referred to as categories or degrees. For example, the tiers may establish degrees of "goodness." FIG. 8 illustrates four or five tiers of grading. In one embodiment, there may be multiple screen parameters from which the grades are established. There may be a combined grade based on a block's performance for each of the screen parameters, or there may be multiple grades for each block based on the block's individual performance for each of the screen parameters.

This grading system may allow for higher net yield since it may be no longer necessary to lose full capacity as a result of test sensitivity or marginality. Instead, the system may manage the marginality by adjusting usage or performance as needed. Since the number of low-rated blocks may still be a small number compared to the total population, the impact of such adjustments may be spread-out and averaged such that it does not adversely affect the user experience. The blocks can be graded based on which tier of the grading system they would pass. Blocks that pass the screen on the left may have very high quality so they are grade A 802, but not too many blocks would be in that category because there would be a large yield loss. Being higher on the yield loss curve 704 is bad because there are fewer units that would pass the quality control test. Conversely, the blocks on the far right of the diagram are labeled with a grade F 808. Utilizing a testing value in the grade F 808 range would result in almost every unit passing (low yield loss 704), but there is a high chance that they would include defects. Further, there may be an additional grade to the right of grade F that would represent even better yield but lower quality. It is not shown in FIG. 8, because the quality may be too low and there may be a minimum bar for the quality (minimized defects).

The grading system in FIG. 8 may be used for establishing certain restrictions on blocks. For example, the grade A blocks 802 may have no restrictions, while the grade F blocks 808 may have the maximum restrictions, including potential exclusion of those blocks. Grade D 806 would tag blocks to be as available to use with restrictions, while Grade B 804 would tag blocks with fewer restrictions. As shown, the screen parameter tagging range 802 encompasses three tiers, Grade B 804, Grade D 806 and Grade F 808.

Figure 9:
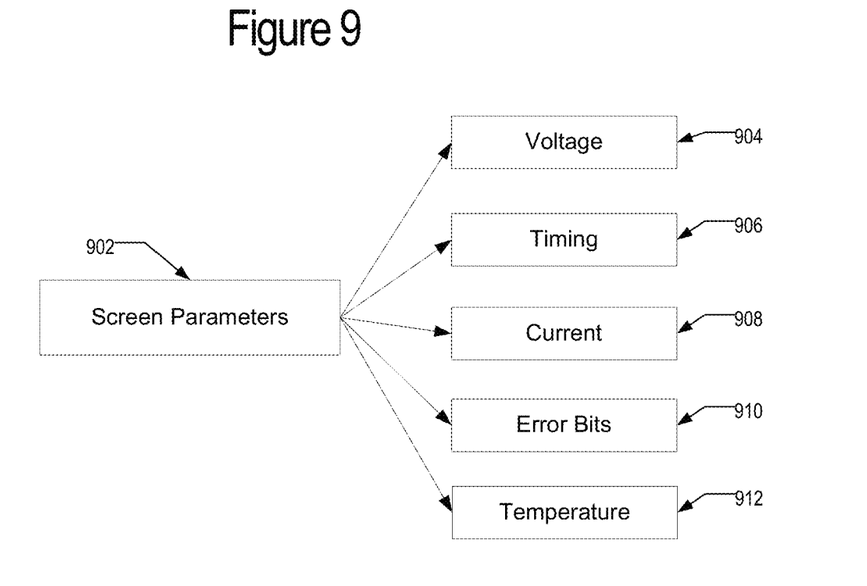
FIG. 9 illustrates exemplary screen parameters that are used for quality testing.

FIG. 9 illustrates exemplary screen parameters 902 that are used for quality testing. The screen parameters 902 may include voltage 904, timing 906, current 908, error bits 908, and/or temperature 912. The parameters may also be referred to as margins. In one embodiment, the voltage 904 may include a threshold voltage ("Vt"). In other words, the memory blocks may be tested for their voltage to verify that the memory blocks are working properly. The timing 906 may include read-waveform timing parameters, with examples including word level ("WL") or block level ("BL") rise-time control. The current 908 measurement may be of the current at a particular block. The voltage 904, timing 906, and/or current 908 may be determined by digital-to-analog ("DAC") table values or external references. The error bits 910 parameter includes a measurement of the number or count of bits in error. Error bits may be measured directly or could be estimated based on a sample population testing, such that more error bits corresponds to lower grade. The temperature 912 may include an operating temperature or a bake temperatures used to accelerate data-retention mechanisms. There may be additional testing done at extreme environmental conditions that include temperature. For example, a data retention test may test a write pattern after baking at a high temperature for a fixed duration and measuring data to verify no data loss. Finally, the testing may utilize certain extreme data patterns that are designed to amplify known physical effects.

Figure 10:
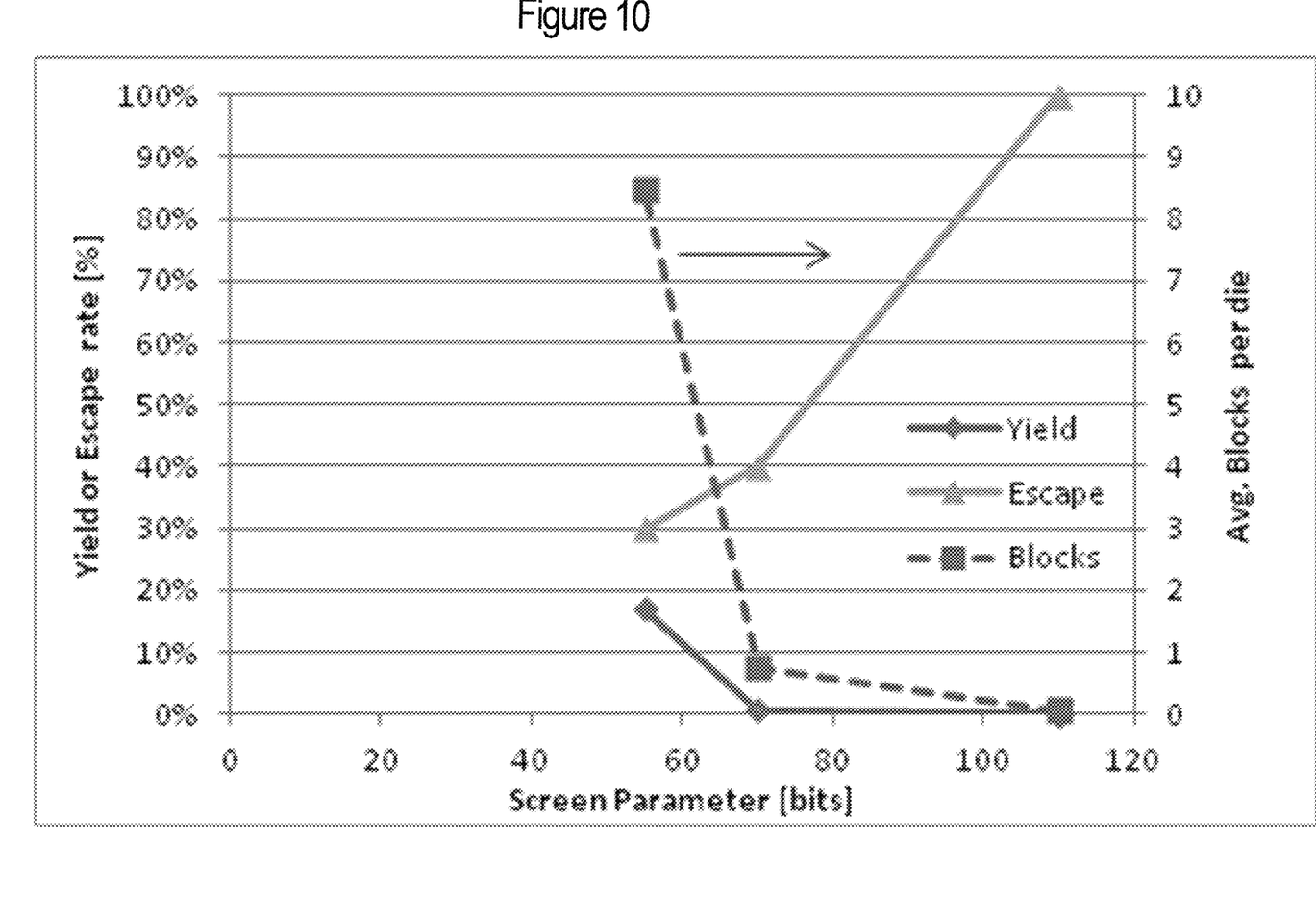
FIG. 10 is a graph using a bit error parameter.

FIG. 10 is a graph using a bit error parameter 910. The x-axis illustrates a number of bits in error. There is a yield loss line, a defects escaping line, and a number of blocks line. The number of blocks line may be similar to yield because yield may be measured two different ways: 1) the number of units that fail; and 2) the number of blocks that are marked per die, so the reason for a fail is when the number of blocks per die exceeds some limit and the red dash line represents the number that actually exceed the limit. The blocks line may be an average number of blocks.

A pattern is written and then read back and the bits that are mismatched are counted for the number of bits in error. The number of error bits may be a threshold value by which the memory is measured. For example, if approximately 110 mismatched bits are allowed, then there are no blocks failing and no yield loss as shown in FIG. 10, but there is a very high level for escaped defects. Conversely, if 55 mismatched bits are allowed, there are approximately 8.5 blocks per die detected and the defects escaped are 3, while the yield loss is approximately 15%. With a yield loss of 15% of the units overall that did not qualify for this grade, this is an expensive test because it means that 15% of the units are thrown out in order to get the escape rate down from 10 to 3. Accordingly, utilizing the grading system can be more efficient at lowering the escape rate without throwing out a large number of units. For the 55 mismatched bit scenario, the 85% of the units that pass are a good grade (e.g. grade A or B), while the other 15% of the units that would have been lost may be screened at 70 mismatched bits (rather than 55 mismatched bits) and they would be given a lower grade (e.g. grade C) because they have more blocks escaping, but they may still be used subject to potential restrictions as discussed below.

Figure 11:
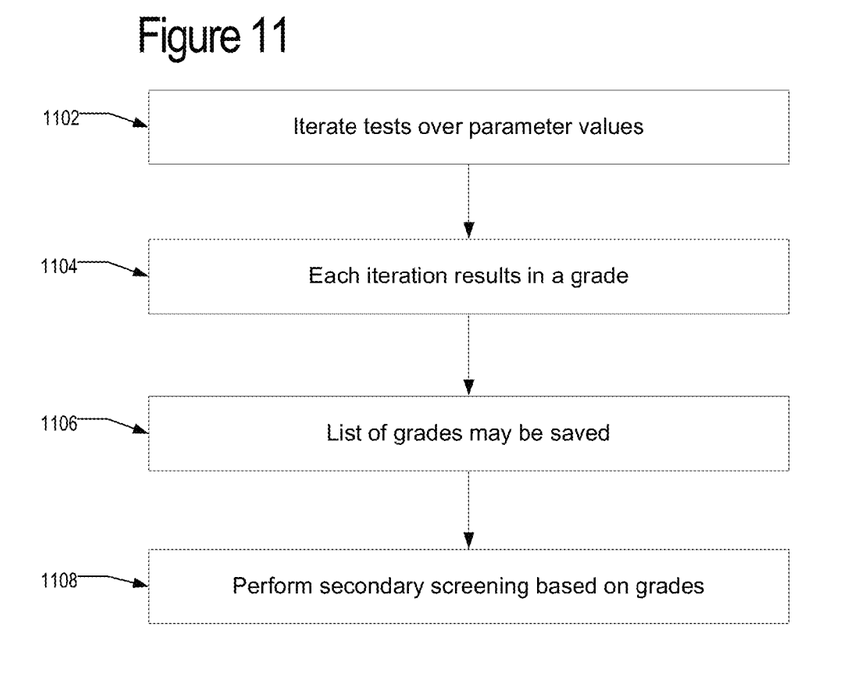
FIG. 11 is a process for generating grades.

FIG. 11 is a process for generating grades. In block 1102, multiple tests or screens can be implemented over multiple parameter values. In one embodiment, there may be an iteration over the multiple tests and parameter values. In block 1104, each iteration results in a grade for each memory block. The list of grades may be saved in block 1106. In one embodiment, the list is a bad block listing that is stored in the non-volatile memory in a format similar to that used by ROM-FUSE. ROMFUSE is read only memory that is burnt into the chip and used to store configuration information and the grading information. There may be multiple lists for multiple parameters and/or multiple tests and the various lists can be stored encoded in a format similar to that used for the ROM-BLOCK with a data/data# parity coding with redundant copies. Different grades may be stored at different pre-defined locations (e.g. different WL's, different column addresses). The list of marginal blocks may not be included in the map of unavailable factory blocks. In one embodiment, the list may just include those grades that are below the "good" grade. In other words, the default grade for all blocks is good and those that fail one or more tests may then receive a grade that is part of the list of grades. The list of grades may be take up less space by leaving the default/good blocks off of the list.

In order to improve response time, the system may copy the maps to RAM on the controller. The map may take the form of a physical map where each memory location corresponds to a physical block and the data in that location indicates the grade of the block. The amount of memory required for this system is the number of blocks under management multiplied by the amount of grade information stored. Alternatively, if the list of graded blocks is small, it may be more efficient to manage the map as a list of blocks wherein a list of address/grade information is stored. For large densities, the size of the map may become large. So the system may elect to load only a portion of the map at a time. For example, only a single die's information may be resident in RAM at a time.

Figure 12:
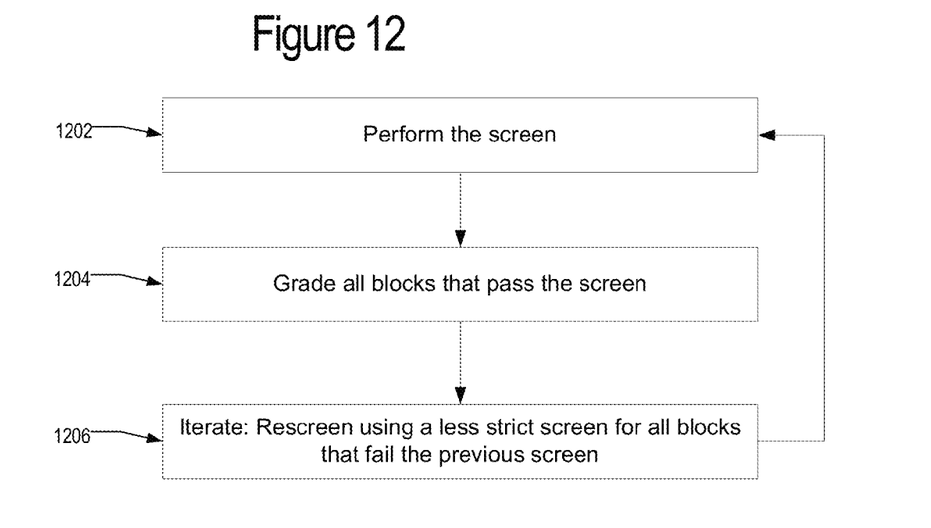
FIG. 12 is an iterative process for multiple screenings.

The stored listing of grades can be used for determining usage restrictions for memory blocks as described below with respect to FIG. 13. The listing of grades may also be used for determining potential secondary screenings or secondary testing for certain blocks as in block 1108. Some screens may be too time consuming or too unstable to apply to the whole array. However, if only a small subset of blocks are questionable (lower-grade) the extra or secondary screens can be run specifically on these blocks. Similarly, these questionable blocks can also be targeted for extra burn-in cycles. The results of the secondary screening may be a refinement of the grade information (e.g. grade B may become B1, B2, B3, etc.), or it may result in the block being permanently removed from the available pool (resulting in a reduction in capacity but higher overall reliability). FIG. 12 further describes the iterative process of applying multiple (secondary) screenings.

FIG. 12 is an iterative process for multiple screenings. In block 1202, a screen or test is performed at a certain level. In block 1204, all blocks that pass the screen are given a grade. For example, all blocks that pass are given a Grade A after the first iteration. In block 1206, all blocks that did not pass the prior screen are rescreened with a less strict screen. The less strict screen is performed and all blocks that pass that screen are given a Grade B after this second iteration. All blocks that fail the second less strict screen may then be rescreened again with an easier screen. This iteration may be repeated for multiple tiers or grades. The tests or screens after the first screen may be referred to as secondary screening and is a way to further classify potentially bad blocks.

The iteration may start with the most restrictive condition (largest list), then the next iteration may only evaluate on the previous list (rather on the whole array). Accordingly, each iteration becomes progressively faster. To minimize test time, a built-in self-test ("BIST") function may be implemented which only scans the previous list. The BIST is an on-chip function that utilizes logic on the chip for running a test. Accordingly, the list of grades may be updated using the on-chip logic. Further, the BIST may rely on an existing list of grades to select which blocks (e.g. "at risk" blocks) are subject to the tests. In other words, the BIST may be customizable using existing results for efficiency purposes and to maintain a current and up-to-date grading of the blocks.

The secondary testing may involve writing/reading multiple data patterns. Normal testing may include writing one pass through the array using "normal" mode with one pattern. A sample read may be used in order to save test time at the cost of accuracy. A first order margin might be another pass through the memory to test one sided (either positive or negative) margin. A second order test might be another pass to check the other side margin (negative/positive). A 3rd order might involve additional special patterns. In another example, there may be one pass through the whole array at the first test at (for example) high temperature and then the subsequent (secondary) pass through a subset of the array with another test at low temperature. The 2nd pass might save test time by skipping the previously identified high-grade blocks and focusing on the low-grade blocks.

The grading system may include multiple additional tests that are performed to determine particular grades. Table 1 illustrates exemplary tests/screens and potential corresponding grades based on those tests. The grading system may include more or fewer grade options and may include more or fewer types of tests.

TABLE 1

Grading System Tests or Screens.

| | Grades | | | | | |
|---|---|---|---|---|---|---|
| Additional Tests | A | B | C | D | E | F |
| 1. Skip additional screen | X | | | | | |
| 2. Apply secondary screen | | X | ○ | ○ | ○ | |
| 3. Apply X cycles of burn-in | | | X | ○ | ○ | |
| 4. Apply 2*X cycles of burn-in | | | | X | ○ | |
| 5. Restrict to SLC | | | | | X | |
| 6. Mark as bad | | | | | | X |

As shown in Table 1, the first test can be for any parameter value threshold and any blocks that pass the first screen can skip additional screens and are given an A grade. In one example, the O's represent a grading system for an Original Equipment Manufacturer ("OEM"), while the X's represent a grading system for retail sales. The differences in grading system depending on the end user is further described below with respect to FIG. 13. In an ideal test, the majority of the blocks are given an A grade, so the following additional tests are only applied on a smaller subset of blocks. The second test is a secondary screen that is applied to the blocks that did not pass the first screen. The blocks that pass the secondary screen may be given a B grade. The third and fourth tests may be apply a certain number of cycles of burn-in. The burn-in test may be a programmed number of cycles for identifying which blocks may be bad since it may be more common for errors or faults to appear in an initial block use (e.g. first 100 cycles, etc.). The burn-in may be referred to as exercising the blocks.

If the first four tests in Table 1 all fail, then the fifth test may be to limit a particular block to only being a SLC rather than an MLC. In other words, that memory cell may not be suitable for two or more bits per cell. Table 1 grades this tier as an E grade. Finally, if all prior tests are failed, then the remaining cells (that failed each test) may be marked as bad and rejected. The bad cells that are rejected receive an F grade.

As mentioned, there may be multiple grades for multiple tests and multiple screening parameters. Accordingly, an individual block may have multiple grades that provides an even more nuanced categorization of memory. For example, an ideal block may have an AAA rating (when there are three grade options) because it was graded with an A for three tests. This might compare with an AAB rating or an ABB rating that is still good, but not quite as good.

Figure 13:
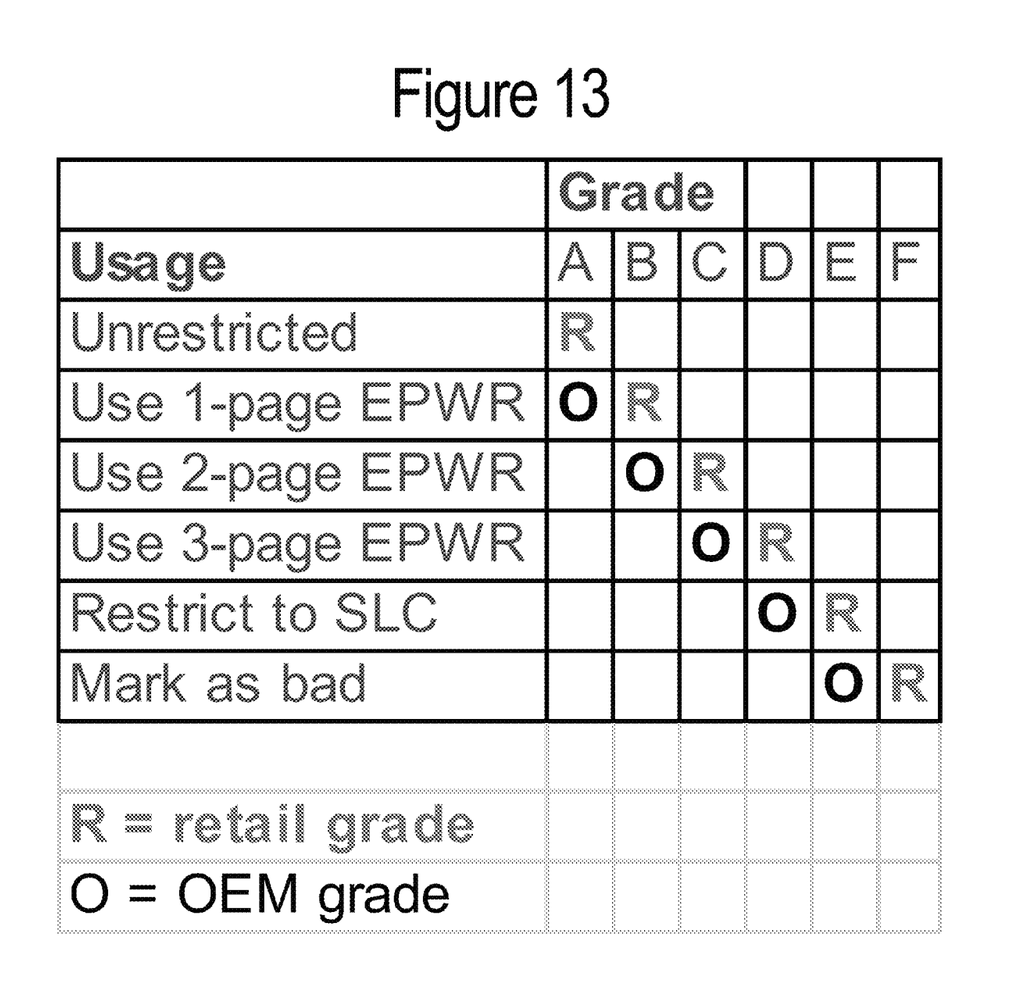
FIG. 13 illustrates restrictions based on the grading system.

FIG. 13 illustrates restrictions based on the grading system. In one embodiment, the restrictions may be dependent on where the memory chip may be sold. Accordingly, FIG. 13 illustrates a grading system for retail memory chips labeled "R" and original equipment manufacturer ("OEM") labeled "O." The difference may be a balancing of quality/reliability versus performance. The grading system may be implemented in production for making decisions about where particular blocks are used (e.g. retail vs. OEM). However, the grading system may also be implemented in the field at the customer side because the controller has access to the list of grades and the ability to perform additional tests for updating the list of grades.

In FIG. 13, depending on the grade of the memory block, the system may choose to use the block in different ways. For example, some blocks may be approved for un-restricted use. Other blocks might be approved for SLC and not MLC (or vice-versa). Some blocks may be used but with restrictions such as lower-performance, high-reliability operation. Exemplary restrictions may include extra verifies to ensure data integrity, which are also known as enhanced post-write-read ("EPWR"). Another example is to write distributions with smaller, high-resolution step-sizes which will give improved voltage windows and smaller bit-error rates. The EPWR test is basically each time a block is written, the written data is read back, and there are comparisons to count how many errors are in the data. This may be a time and resource consuming test that should not be run on all blocks, but may be run on "at-risk" blocks. In addition, the EPWR for a 3 bit per cell block may have options to read back 1 page, 2 pages, or 3 pages corresponding to the 3 bits in the cell. Reading back only 1 page is faster but not a full testing because the result for the 1 page is being used to infer the result from the other 2 pages. Reading back all 3 pages provides a high degree of confidence that the data is good, but it took 3 times as long in doing so. Accordingly, the high confidence 3-page EPWR may only be run for higher risk cells (e.g. Grade D for retail).

Another restriction on blocks may be usage. Lower grade blocks might be used fewer cycles. For example, grade A blocks may be adapted for 3000 cycles, while grade B may only be used for 1000 cycles. From the system level, when the memory is managed, it is the total number of data that can be written which matters, so that may be satisfied since the lower grade blocks are still used, they just will go through fewer cycles. Some blocks might be rated to operate only up to some limit of endurance that is less than the full system-level rating. This can be utilized by adjusting the wear-leveling algorithm such that lower grade blocks can be avoided. Since the blocks are still used to store data, there is no storage loss in capacity. The lower grade blocks may be held in reserve as another restriction. The lower grade blocks may be shipped as spare blocks so that they can account for any management that is needed in the field in the case some blocks go bad, then the spare blocks can be mapped in. The low grade blocks may be required to operate with higher error-correction coverage, which may means sacrificing performance or capacity due to less efficient ECC coding. If some blocks have lower reliability on certain physical locations, those locations may be skipped. Examples may include the physical edge wordlines or columns. Finally, if the system defines that some "temporary" data can afford to operate with lower-reliability (e.g. a scratchpad buffer), then lower-grade blocks may be assigned for this purpose.

Other system functions may include using extra error correction codes ("ECC"). The ECC code may have a penalty in terms of performance and overhead, but when used on a subset of the blocks may help provide information about the blocks. A Redundant Array of Independent Discs ("RAID") concept may be used for a group of blocks. Some capacity of the memory may be assigned to write some encoded back up information which is a redundant RAID capacity that is used to back up low quality blocks. The high quality blocks for grade A may not need any back up, but the lower quality parts may be used together with this back up pool.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a processor, memory device, computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A flash memory device comprising:
    a non-volatile storage having an array of memory blocks storing data; and
    a controller in communication with the non-volatile storage, wherein the controller is configured to:
        test at least a portion of the memory blocks;
        grade the tested memory block by assigning each of the tested blocks one of at least three grades; and
        restrict usage for some of the memory blocks based on the grade for those memory blocks.

2. The device of claim 1 wherein the controller is further configured to:
    providing additional tests for additional grades, wherein each assigned grade is based on passing at least one of the additional tests.

3. The device of claim 1 wherein two of the at least three grades comprise a classification of good blocks and a classification of bad blocks.

4. The device of claim 3 wherein the good blocks have no restrictions on usage.

5. The device of claim 1 wherein the controller is configured to analyze a parameter value, wherein the parameter value comprises at least one of a voltage, timing, current, error bits, or temperature.

6. The device of claim 1 wherein the controller is configured to restrict usage via at least one of a restriction to single level cell memory, a restriction for an enhanced post-write-read ("EPWR") to one page, two pages, or three pages, a restriction in usage, a restriction in wear-leveling, a restriction to temporary data storage, or a restriction to higher error-correction coding coverage.

7. A method for block level grading in flash memory comprising:
    in a non-volatile storage device having a controller and blocks of memory, the controller:
        performing an initial test on the blocks of memory;
        assigning a first grade to blocks that pass the initial test;
        performing a second test on blocks that did not pass the initial test;
        assigning a second grade to blocks that pass the second test; and
        assigning a third grade to blocks that did not pass the second test.

8. The method of claim 7 wherein the third grade identifies bad blocks.

9. The method of claim 7 wherein the first grade identifies good blocks.

10. The method of claim 7 further comprising the controller:
receiving results from a third test on those blocks that did not pass the second test; and
assigning a fourth grade to those blocks that did not pass the third test.

11. The method of claim 7 further comprising the controller:
storing a list of the grades for the blocks of memory that did not pass the initial test.

12. The method of claim 11 further comprising the controller:
updating the stored list of the grades when additional tests are performed.

13. The method of claim 7 wherein the initial test or the second test comprise an analysis of a parameter value.

14. The method of claim 13 wherein the parameter value comprises at least one of a voltage, timing, current, error bits, or temperature.

15. The method of claim 7 further comprising the controller:
restricting usage of the memory blocks based on the assigned grades.

16. The method of claim 15 wherein the blocks assigned the first grade include no restrictions.

17. The method of claim 15 wherein the blocks assigned the second or third grades include at least one of a restriction to single level cell memory, a restriction for an enhanced post-write-read ("EPWR") to one page, two pages, or three pages, a restriction in usage, a restriction in wear-leveling, a restriction to temporary data storage, or a restriction to higher error-correction coding coverage.

18. A memory system comprising:
a non-volatile storage having an array of memory blocks storing data; and
a controller in communication with the blocks, the controller configured to:
perform an initial test on at least some of the blocks;
assign a first grade to those blocks that pass the initial test;
perform a secondary test on those tested blocks that did not pass the initial test;
assign a second grade to those blocks that passed the secondary test and assigning a third grade to those blocks that did not pass the secondary test; and
store a listing of at least some of the grades on one or more of the blocks.

19. The memory system of claim 18 wherein the controller is further configured to:
update the listing of the grades based on additional tests.

20. The memory system of claim 18 wherein the controller is further configured to:
update the listing of the grades by iterating the initial and secondary tests and reassigning or confirming grades based on those tests.

* * * * *